United States Patent
Trimberger

(10) Patent No.: US 7,353,374 B1
(45) Date of Patent: Apr. 1, 2008

(54) INTEGRATED CIRCUIT WITH SUPERVISORY CONTROL CIRCUIT

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 397 days.

(21) Appl. No.: 10/874,476

(22) Filed: Jun. 22, 2004

(51) Int. Cl.
*G06F 9/00* (2006.01)
*G06F 9/44* (2006.01)

(52) U.S. Cl. .......................... 713/1; 713/100; 719/327
(58) Field of Classification Search .................. 713/1, 713/100, 300, 160; 716/16, 17; 326/37, 326/41; 710/10; 365/230.05; 712/208, 712/210
See application file for complete search history.

(56) References Cited

U.S. PATENT DOCUMENTS

| | | | | |
|---|---|---|---|---|
| 5,535,406 A | * | 7/1996 | Kolchinsky | 712/10 |
| 6,243,818 B1 | * | 6/2001 | Schwan et al. | 713/300 |
| 6,496,971 B1 | * | 12/2002 | Lesea et al. | 716/16 |
| 6,529,041 B1 | * | 3/2003 | Ng et al. | 326/40 |
| 6,617,877 B1 | * | 9/2003 | Cory et al. | 326/41 |
| 6,661,733 B1 | * | 12/2003 | Pan et al. | 365/230.05 |
| 6,664,808 B2 | * | 12/2003 | Ling et al. | 326/41 |
| 6,801,995 B1 | * | 10/2004 | Alidina et al. | 712/210 |
| 6,941,456 B2 | * | 9/2005 | Wilson | 713/160 |
| 6,973,658 B2 | * | 12/2005 | Nguyen | 719/327 |

OTHER PUBLICATIONS

Chow et al, OneChip: An FPGA Processor With Reconfigurable Logic, 1996, IEEE, pp. 126-135.*

* cited by examiner

*Primary Examiner*—Suresh K Suryawanshi
(74) *Attorney, Agent, or Firm*—LeRoy D. Maunu

(57) ABSTRACT

An integrated circuit (IC) with a supervisory control circuit is disclosed. In various embodiments, the IC includes a plurality of configurable logic resources and interconnection circuitry. A first interface circuit is coupled to a set of interface ports that are coupled to the interconnection circuitry, and a second interface circuit is coupled to the device management resources. A control store is configured with control codes for accessing the device management resources. Responsive to a command received via the first interface circuit, a control circuit is configured to fetch selected control codes from the control store, execute the control codes, and access a selected device management resource via the second interface circuit.

19 Claims, 5 Drawing Sheets ized to implement a particular function, such as high-speed input/output. A device management resource may be configurable to perform a set of related functions. Example device management resources include digital clock manager resources, temperature sensors, security keys, device power controls, and error checking controls.

INTEGRATED CIRCUIT WITH SUPERVISORY CONTROL CIRCUIT

FIELD OF THE INVENTION

The present invention generally relates to accessing device management resources of an integrated circuit (IC) such as a programmable logic device (PLD).

BACKGROUND

A programmable logic device (PLD) may be configured to perform a variety of functions. In addition to logic resources that are configurable to implement general logic functions, a PLD may contain device management resources that are optimized to implement a particular function, such as high-speed input/output. A device management resource may be configurable to perform a set of related functions. Example device management resources include digital clock manager resources, temperature sensors, security keys, device power controls, and error checking controls.

An application function implemented in a PLD may access a device management resource from the general purpose logic resources via an on-device, dedicated interface. As the number of device management resources on a device grows, so too will the number of specialized interfaces to these resources. Not only are the interfaces to the device management resources competing for chip space with the logic resources, but restricting access by application logic to certain device management resources may be desirable in order to prevent unintended consequences, such as unintentionally powering down the chip.

The present invention may address one or more of the above issues.

SUMMARY OF THE INVENTION

The various embodiments of the invention provide an integrated circuit (IC) such as a programmable logic device (PLD) with a supervisory control circuit. The IC includes a plurality of configurable logic resources and an interconnect circuit configurable to selectively couple the configurable logic resources. The IC also includes a plurality of device management resources. A first interface circuit is coupled to a set of interface ports that are coupled to the interconnect circuit, and a second interface circuit is coupled to the device management resources. A control store is configured with control codes for accessing the device management resources. A control circuit is coupled to the first interface circuit, the second interface circuit, and the control store. Responsive to a command received via the first interface circuit, the control circuit is configured to fetch selected control codes from the control store, execute the control codes, and access a selected device management resource via the second interface circuit in response to executing the control codes.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
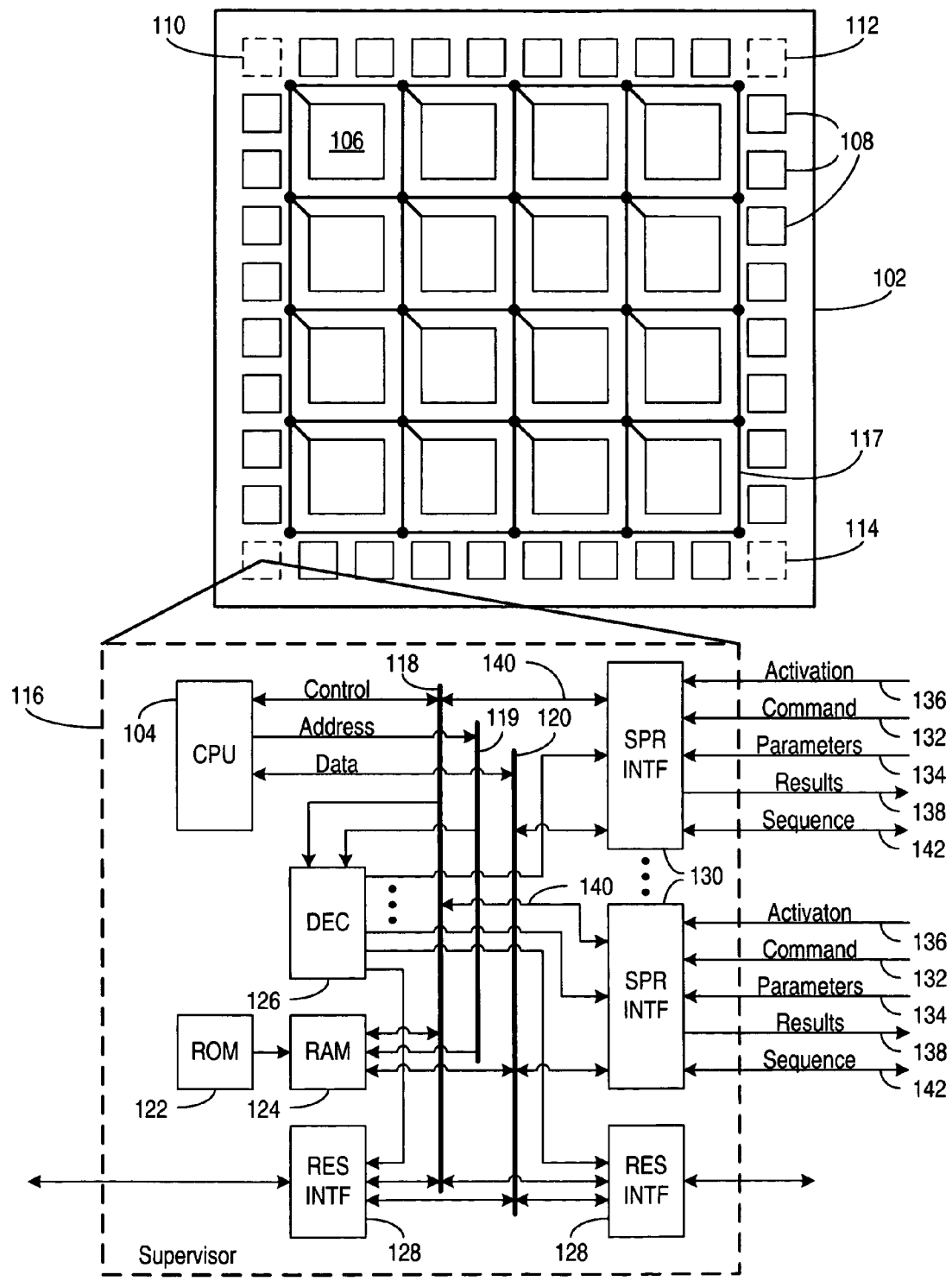
FIG. 1 is a block diagram of an example PLD with an embedded processor that provides access to various device management resources of the PLD in accordance with various embodiments of the invention.

FIG. 1 is a block diagram that illustrates an example PLD 102 with an embedded processor 104 that provides access to various device management resources of the PLD 102 in accordance with various embodiments of the invention. The example PLD 102 includes a central logic plane of configurable logic blocks (CLB) 106, or CLBs and microprocessors (not shown), that are surrounded by input/output blocks (IOB) 108. Other PLDs may also include high-speed serial transceivers (not shown) on the outer edges. Corner blocks 110, 112, 114, and 116 occupy each corner of the PLD 102. Configurable interconnect 117 allows the CLB 106, the IOB 108, and corner blocks to be selectively coupled. Each of the corner blocks may contain distinct block types, or one or more of the corners blocks may contain duplicate instantiations of a block type. In the example PLD, the details of corner block 116 are illustrated. Corner block 116 is referred to as a supervisor block 116 and includes an embedded processor 104. It will be appreciated that PLDs having different layouts of CLBs, IOBs, and interconnect circuitry (and the functional equivalents thereof) may also implement the various embodiments of the invention described herein. For example, IOBs and memory blocks may be distributed in vertical stripes through the chip; multiple CLBs, memory blocks or IOBs may be replaced by a microprocessor, memory array or control logic from a corner block.

The supervisor block 116 has a processor 104 that may be functionally equivalent to any implementation-suitable microprocessor, a control bus 118, an address bus 119, and a processor data bus 120. The processor 104 fetches instructions and data for a supervisor program from ROM 122 and RAM 124. A decoder 126 uses the address bus 119 and signals from the control bus 118, such as program read, memory read, and memory write, to map certain processor 104 accesses to the resource interfaces 128 and the supervisor interfaces 130. The control bus 118 may include a clock signal that may be generated external to supervisor 116. The instructions or control codes for the processor 104 may be in ROM 122 or be compiled into gates for different embodiments of a control store. In other embodiments, the processor 104 may resemble a sequencer or state machine more than a CPU.

The resource interfaces 128 allow the supervisor 116 to manage various resources of the PLD 102. These device management resources may be also located in the corner blocks 110 112 114 116. Even though only two resource interfaces 128 are shown for the supervisor 116, additional resource interfaces 128 may be implemented to interface with each of the device resources that may be managed by the supervisor 116.

The supervisor interfaces 130 allow application logic in the central logic plane to send service requests to the supervisor 116. In an example embodiment, application logic sends a service request to the supervisor 116 by specifying the request on the command bus 132, providing any request parameters on the parameter bus 134, and indicating the presence of the request by asserting the activation signal 136. For certain requests the supervisor 116 may return request results over the results bus 138. A supervisor interface 130 may assert an interrupt line 140 of control lines 118 to notify the processor 104 when an activation signal 136 is received.

The sequence control lines 142 are used to handshake the transfer of commands, parameters, and request results. A sequence of transfers over the parameter bus 134 or the results bus 138 may be used for certain commands for the request parameters or the request results, respectively.

A 4-phase handshake protocol may be used with the sequence control lines 142 including a REQUEST signal sourced by the application logic in the central logic plane, and an ACKNOWLEDGE signal sourced by a supervisor interface 130 of the supervisor 116. Initially the REQUEST and ACKNOWLEDGE signals are inactive. Application logic may request a service by asserting the activation 136 signal and the REQUEST signal after specifying the request on the command bus 132 with optional parameters on the parameter bus 134. The supervisor 116 may indicate receiving the request and any initial parameters by asserting the ACKNOWLEDGE signal. The application may respond to the asserted ACKNOWLEDGE signal by de-asserting the REQUEST signal, which may cause the supervisor 116 to de-assert the ACKNOWLEDGE signal.

When additional parameter transfers are required, the transfer handshake is repeated with the application logic asserting the REQUEST signal after specifying the additional parameters on the parameter bus 134. In one embodiment, the supervisor 116 may indicate receiving the final parameter transfer by asserting the ACKNOWLEDGE signal. In another embodiment, the supervisor 116 waits until all processing for the request is completed before asserting the ACKNOWLEDGE signal for the final parameter transfer, thus additionally indicating that the supervisor 116 is ready to process the next request.

The request-acknowledge sequence allows the supervisor 116 to implement an arbiter simply and efficiently. An arbiter allows only one command to be processed at a time, thereby preventing conflicts. In one embodiment, the processor 104 polls each supervisor interface 130 in succession. When the processor 104 finds an asserted REQUEST signal, it directs the supervisor interface 130 to assert an ACKNOWLEDGE signal for the request, and stops polling the other supervisor interfaces 130 until the processing of this request is completed.

Similar REQUEST and ACKNOWLEDGE signals may be used to handshake a sequence of transfers over the results bus 138 for results returned from a requested service.

Figure 2:
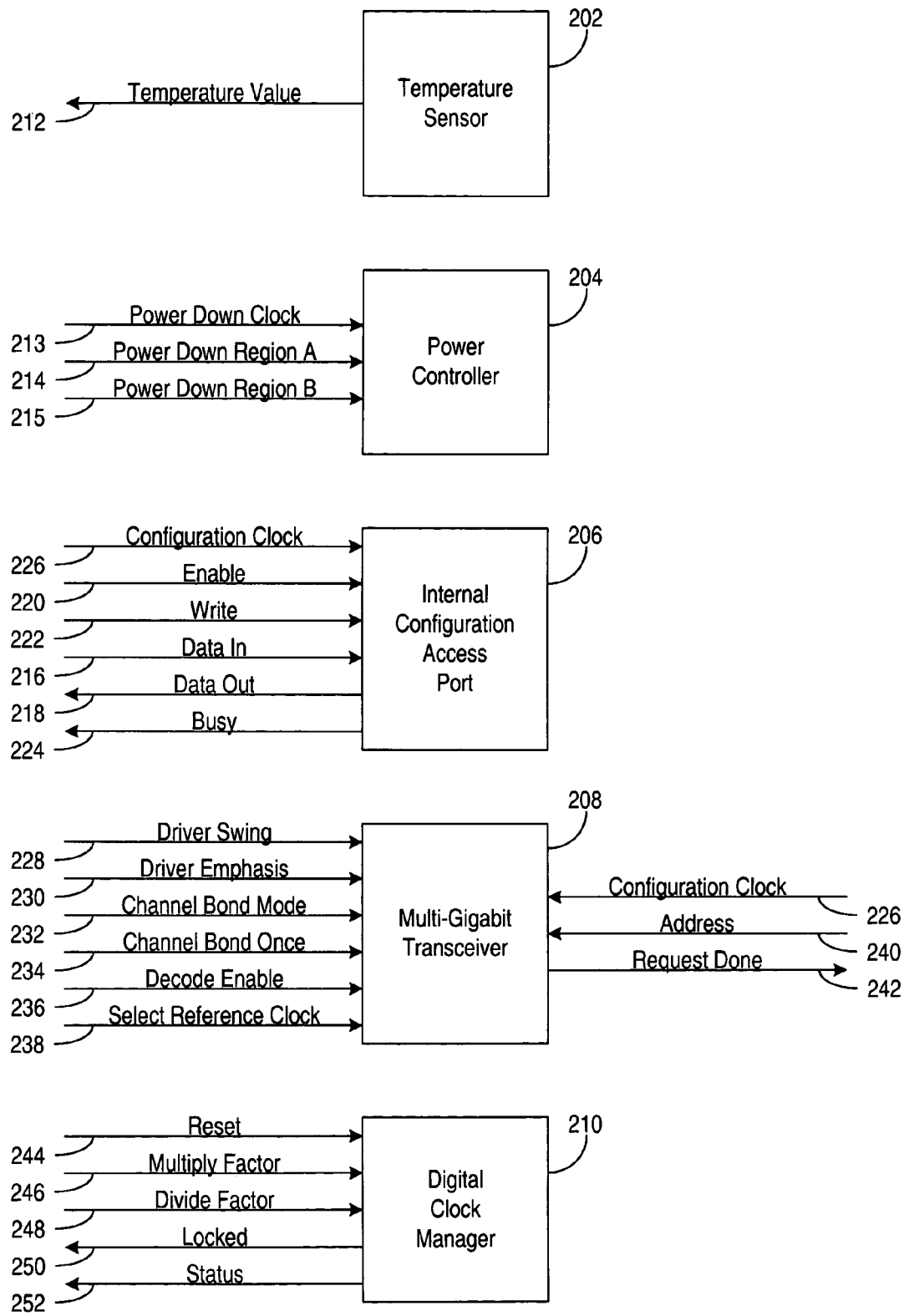
FIG. 2 is a block diagram that illustrates various example device management resources of a PLD.

FIG. 2 is a block diagram that illustrates various example device management resources of a PLD. The example resources include a temperature sensor 202, a power controller 204, an internal port for configuration access 206, reconfiguration of a multi-gigabit transceiver 208, and a digital clock manager 210. There may be multiple instances of one or more of these resources.

The temperature sensor 202 may provide a digital value 212 for the current temperature at a sensor in the PLD. An example application may need the temperature value 212 to control the speed of a cooling fan. Application logic may have the option of obtaining the current temperature value 212 either directly from the temperature sensor 202 or via the supervisor. Accessing the multiple device resources 202, 204, 206, 208, and 210 via the supervisor allows the application to generally use the same protocol (i.e., command, activation, and data) for the different device management resources. Using the supervisor to access device management resources may also be used to isolate interfaces to new device management resources in future PLDs. The interface is extensible as new supervisor functions are created. In addition, the supervisor may provide services such as automatic power down in response to the current temperature value 212 exceeding the specifications for device operation.

The resource interface for the temperature sensor 202 may include a register that provides the current temperature value 212 when read by the supervisory processor. The resource interface may additionally contain registers to specify the temperature range for device operation. The application logic may be allowed to modify the default values for these temperature range limits with a particular service request. Additionally, the resource interface may generate an interrupt to the supervisory processor when the current temperature value 212 exceeds specifications or the supervisory processor may be programmed to poll the current temperature value 212. Generally each resource has a resource interface that is tailored to the function of the resource.

A power controller 204 may have power down control inputs 213, 214, and 215 to signal for the PLD to enter a power saving mode. Power dissipation by the PLD may be reduced in a power saving mode by putting the PLD or a portion of the PLD into a quiescent state. In one example, the clocks are turned off with clock gating by clock power down input 213. In another example, the power supplies for combinational logic are turned off for one or more physical regions of the PLD by region power down inputs 214 and 215.

The power controller 204 may implement multiple levels of power savings, each level activated by a different trigger or temperature. Additional, separate power down controls may be provided by region for clocks, application combinational logic, application storage (flip-flops and block RAM), IOB, or PLD configuration logic.

The contents of application and configuration memory may be retained in certain power saving modes. The application function of the PLD may be quickly restored upon exiting these power saving modes. In one example, during a power saving mode the supervisor retains power. For this example the supervisor may detect the conditions for restoring power, and later direct the power controller 204 to exit the power saving mode. For another example the supervisor may direct the power controller 204 to enter a power saving mode, but other logic determines when to exit the power saving mode.

The resource interface for the power controller 204 may include a register that is addressable by the supervisory processor, with the register containing respective bits that control the power down inputs 213, 214, and 215 of the power controller. The supervisor program may enter and possibly exit a power saving mode by storing the appropriate values in this register, and may do so in response to a service request received from the application logic. In one embodiment, access to the power controller 204 may be a privileged operation. Access may be restricted to application logic having appropriate permissions. Application logic may be able to access the power controller 204 only via a service request to the supervisor, thereby allowing the supervisor to check for appropriate permissions.

The internal port for configuration access (ICAP) 206, allows the supervisor to read, modify, and write the configuration memory of the PLD. Specific implementations of an ICAP are provided in various field programmable gate arrays (FPGAs) from Xilinx, Inc. Access to ICAP 206 may be a privileged operation with access provided only via the supervisor. Alternatively, direct access by application logic may also be provided. A data-in bus 216 allows the supervisor to provide the location in configuration memory and write data. A data-out bus 218 allows data read from configuration memory to be returned to the supervisor. An enable input (line 220) starts data transfer with a write input (line 222) specifying the data transfer direction. While data is being shifted through configuration memory, the ICAP 206 provides a busy output (line 224) to defer further configuration accesses. A configuration clock input (line 226) controls the shifting of data through configuration memory.

The supervisor may provide additional services through ICAP 206 such as a service to read back all of configuration memory and recalculate a CRC value provided during device configuration. Application logic requesting this service is notified whether configuration memory has been modified since device configuration. This service may be useful to allow an application to detect corruption of the contents of configuration memory.

A multi-gigabit transceiver (MGT) resource 208 allows the initial configuration of the MGT to be modified by the supervisor. Specific implementations of MGT are provided in various field programmable gate arrays (FPGAs) from Xilinx, Inc. A supervisor typically modifies an MGT configuration due to a service request from the application logic. For example, application logic may need to reconfigure an MGT to optimize the driver settings to match the physical length of the communication channel.

Examples of multi-gigabit transceiver parameters that may be modified include the drive strength 228 of the MGT driver, the pre-emphasis drive strength 230 of the MGT driver, the channel bonding mode 232 used by the MGT receiver to synchronize a communications channel with multiple MGTs, whether to perform channel bonding once 234 or continuously, whether to enable decode 236 of an 8B/10B code by the MGT receiver, and the selection of a reference clock 238.

An address input 240 specifies whether all MGTs or only one particular MGT is reconfigured. A request done output 242 indicates when the requested reconfiguration is complete. A configuration clock 226 controls the shifting of data through configuration memory.

Modifying specific configuration bits for a multi-gigabit transceiver requires a complex series of ICAP 206 transactions. The complex series of ICAP 206 transactions is device dependent because the layout of configuration memory varies by device. When access to reconfiguration of MGT is provided via the supervisor, the logic to implement the complex commands may be implemented by the supervisory processor, thereby eliminating the need to implement the interface in the application logic. Eliminating this resource reconfiguration logic in the logic plane eliminates the risk that this logic will reconfigure itself. The complex series of device dependent ICAP 206 transactions is implemented in service routines of the supervisor program. The supervisor program may also check for appropriate permissions when MGT reconfiguration is considered a privileged operation.

A digital clock manager (DCM) resource 210 allows a clock generated within the PLD to be reset and restarted at a different frequency. The DCM is reset by the reset input 244. The frequency is changed by using ICAP 206 to modify the multiplication factor 246 and division factor 248 used to generate the clock from a reference clock. As with reconfiguring the multi-gigabit transceiver, a complex series of device dependent ICAP 206 transactions is required to modify specific locations in configuration memory. A routine in the supervisor program implements these transactions.

Application logic makes a service request for reconfiguring the DCM by specifying the new multiplication factor 246 and division factor 248 as parameters of a clock restart command. The service routine may indicate the completion of the service request once the new clock frequency is running and stable. The service routine may use the locked output 250 and status output 252 from the clock generator to determine that the clock is stable.

Figure 3:
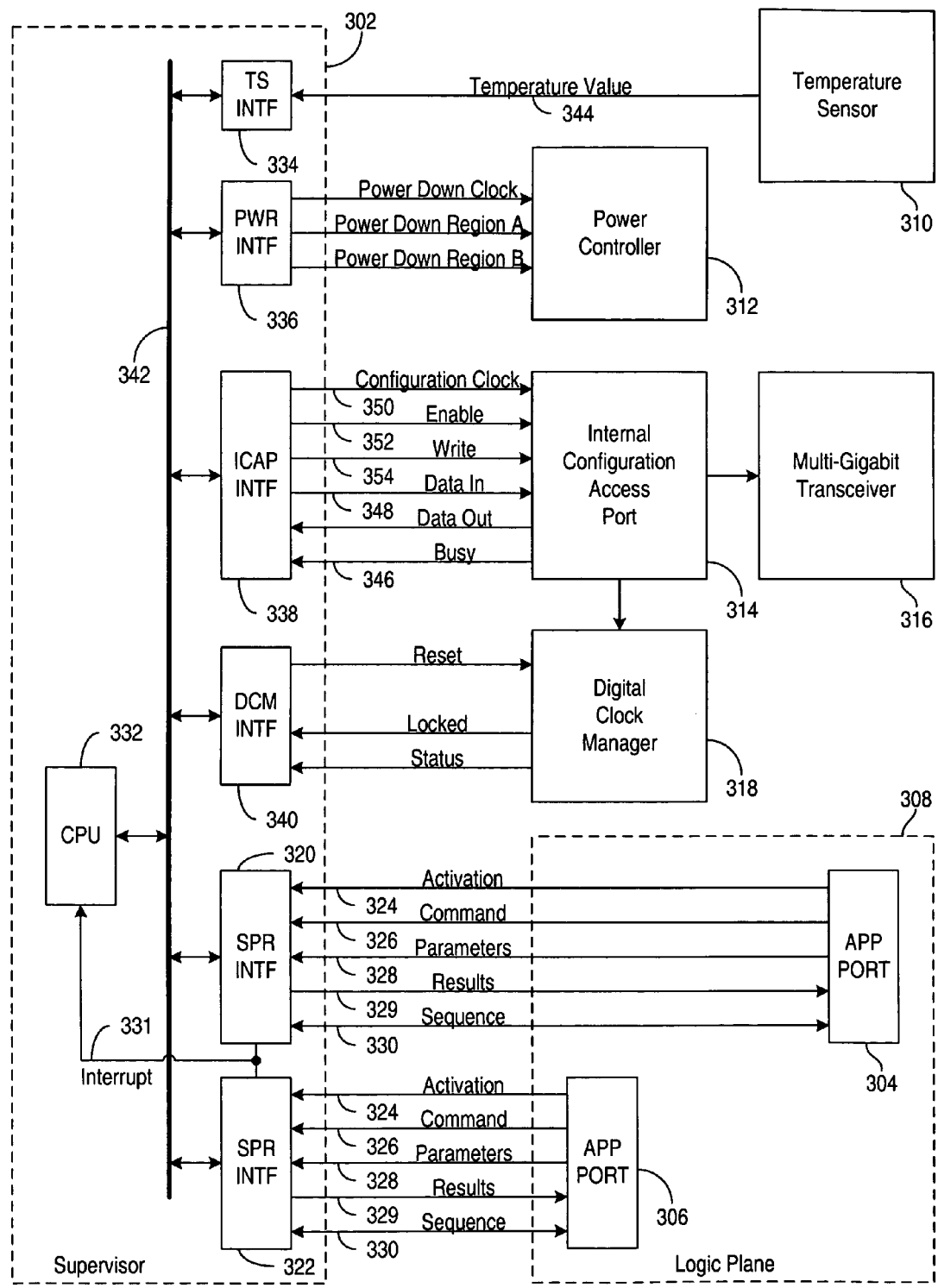
FIG. 3 is a block diagram that illustrates the supervisor coupled to application interface ports in the logic plane of the PLD and coupled to device management resources of the device.

FIG. 3 is a block diagram that illustrates the supervisor 302 coupled to application interface ports 304 306 in the logic plane 308 of the PLD. The supervisor is also coupled to device management resources 310, 312, 314, 316, and 318 of the device. It will be appreciated that other embodiments may have a single application interface port or more than two application interface ports.

Each of application interface ports 304 and 306 is coupled to a respective supervisor interface 320 and 322 within the supervisor. Each of supervisor interfaces 320 and 322 receives an activation signal 324 to notify the supervisor 302 that an application service request is pending with a command on line 326 and parameters on parameter bus 328. At the completion of the service request the supervisor returns any results for the command on results bus 329. The sequence signals on line(s) 330 are used to handshake the command 326 and multi-cycle data transfers on the parameters bus 328 and results bus 329. The activation signal on line 324 may cause a supervisor interface 320 322 to generate an interrupt 331 to the supervisory processor 332. The supervisory processor 332 may poll each of supervisor interfaces 320 and 322 upon receiving an interrupt 331 to determine the source of the interrupt 331. Alternatively, an interrupt priority scheme may be used.

Device management resources 310, 312, 314, and 318 have respective resource interfaces 334, 336, 338, and 340. In one embodiment, the multi-gigabit transceiver 316 does not need a separate resource interface because the multi-gigabit transceiver is exclusively accessed via ICAP 314 for reconfiguration. The supervisor program may have a routine for general modification of configuration memory and a specific routine for modification of configuration memory in the multi-gigabit transceiver. The digital clock manager 318 has a resource interface 340 for certain control and status signals while the clock multiplication and division factors are accessed via ICAP 314.

Each interface 334, 336, 338 and 340 for respective device management resources 310, 312, 314, and 318 may be implemented using status and command registers that are read and written by the CPU 332 via lines 342 containing control, address, and data busses. The address on the address bus of lines 342 may be decoded to determine whether the address corresponds to a register of a particular interface 334, 336, 338, or 340. For such a decoded address for a read request from CPU 332, a value from the addressed interface register may be delivered to the data bus of lines 342 by an interface 334, 336, 338, or 340. For such a decoded address in a write request from CPU 332, a CPU 332 provided value from the data bus of lines 342 may be stored to the addressed interface register by an interface 334, 336, 338, and 340.

A status register of an interface 334, 336, 338, or 340 provides status information from a corresponding device management resource 310, 312, 314, 318. For one example, the temperature sensor interface 334 may have a temperature status register that is set with a temperature value on line 344 periodically provided by temperature sensor 310. The CPU 332 may read the temperature status register of interface 334 to obtain the most recent temperature value. For another example, ICAP interface 338 may have a busy status register containing a bit that provides the value of a busy line 346 from the ICAP 314. The CPU 332 may read the busy status register of ICAP interface 338 to determine whether ICAP 314 is busy.

A command register of an interface 334, 336, 338, or 340 may be used to control a corresponding device management resource 310, 312, 314, 318. For one example, ICAP interface 338 may provide a data-in command register to control the value on line 348, and may provide a control command register containing bits to control the values on lines 350, 352, 354. The CPU 332 may perform a step of a FPGA configuration operation by writing the data-in command register with a word of configuration data followed by a sequence of writes to the control command register to set the enable line 352, set the write line 354, and toggle the configuration clock on line 350. The CPU 332 may then determine when the configuration step is complete by reading the busy status register of ICAP interface 338 before performing the next configuration step.

For another example, ICAP interface 338 may have a data command register that when written by CPU 332 provides the value on line 348 and has associated logic that automatically asserts the enable line 352, asserts the write line 354, and toggles the configuration clock on line 350. The associated logic may additionally generate a busy signal during the transfer of the configuration word from ICAP interface 338 to ICAP 314, with this busy signal combined with busy line 346 to yield a value for the busy status register.

Figure 4:
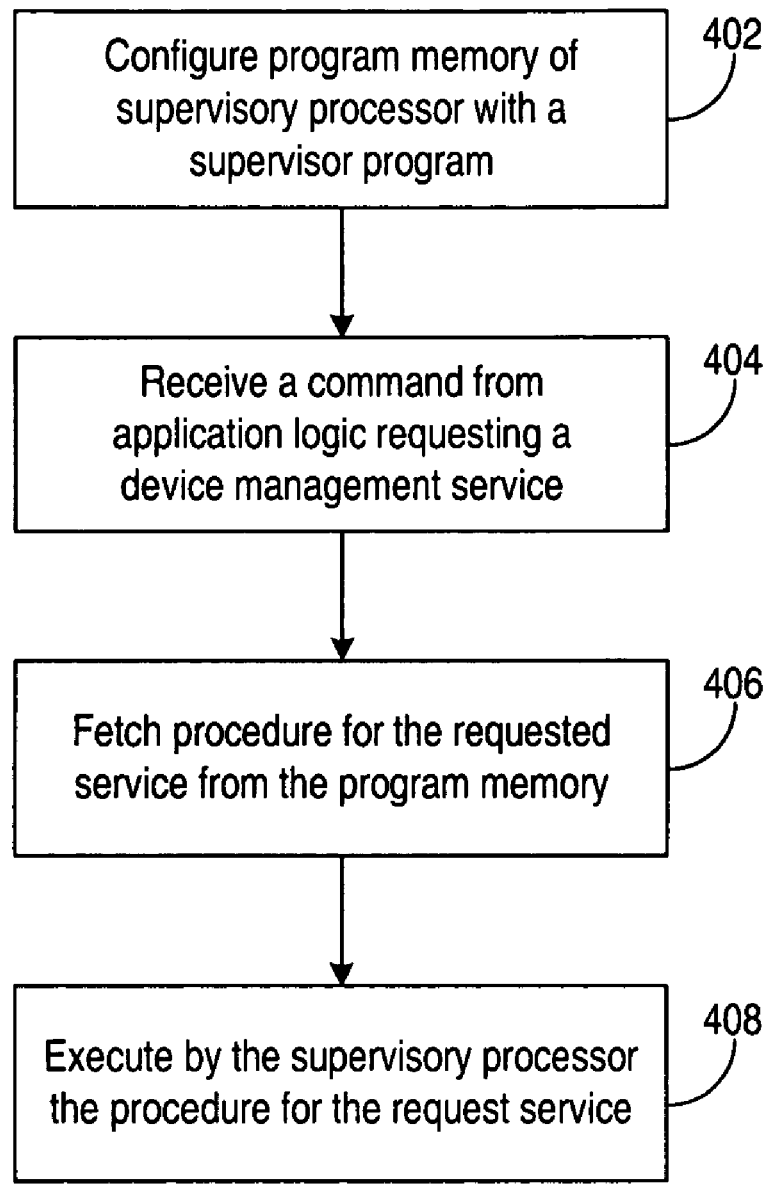
FIG. 4 is a flowchart of an example process for accessing the device management resources via the supervisory processor.

FIG. 4 is a flowchart of an example process for accessing the device management resources via the supervisory processor. At step 402, the program memory coupled to the supervisory processor is initialized with a supervisor program. This initialization may be performed during the configuration of the PLD. The supervisor program comprises a set of service routines. Each service routine is available for performing a management operation on a device management resource of the PLD.

At step 404 a service request is received from the application logic. The application provides a command to request a particular device management service. At step 406 the service routine for this requested service is determined and fetched from the program memory. At step 408 the supervisory processor executes the service routine. The service routine obtains any service parameters from the application. At the completion of the service routine the supervisory processor returns any results to the application.

Figure 5:
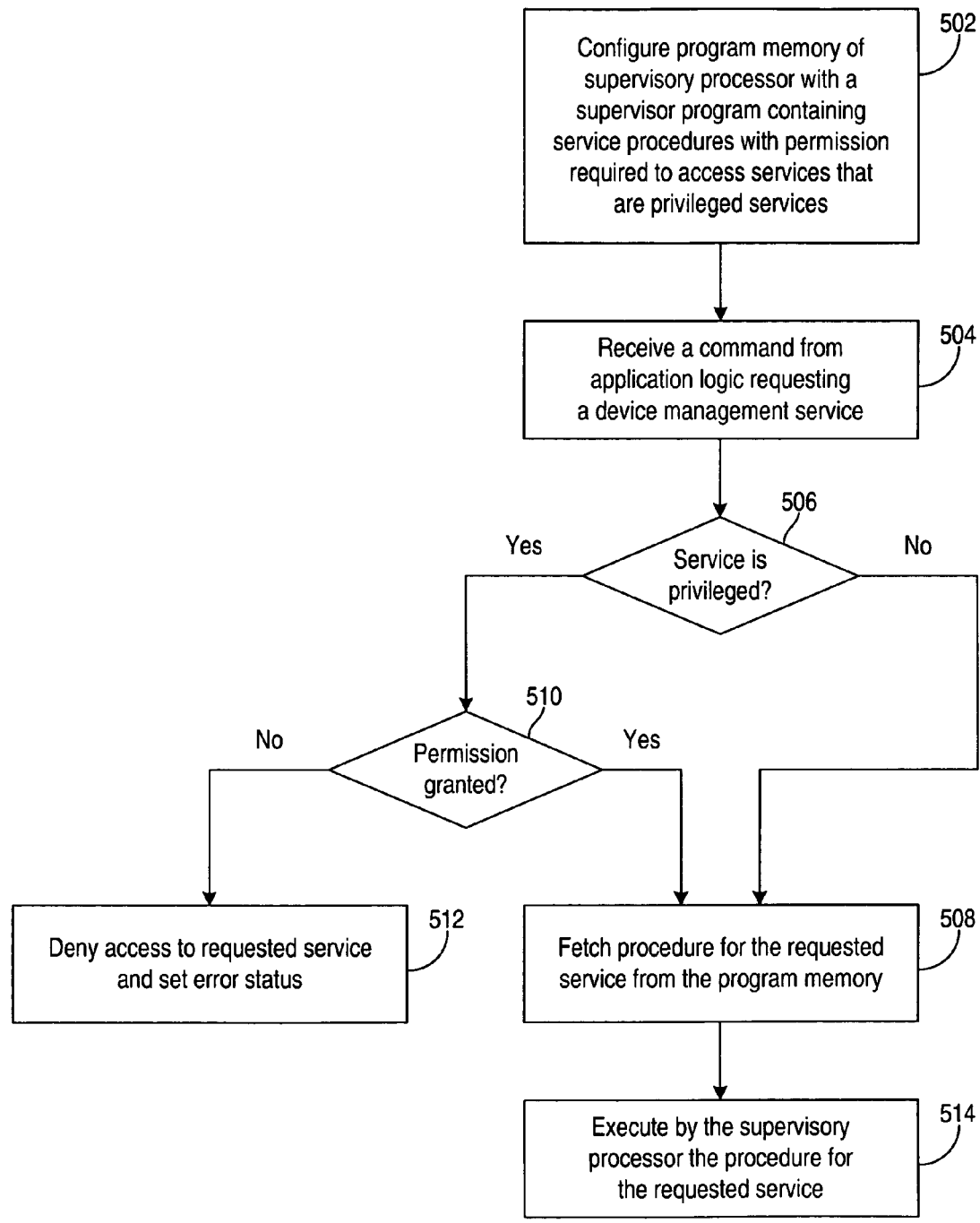
FIG. 5 is a flowchart of an example process for restricting access to supervisory functions provided by the supervisory processor.

FIG. 5 is a flowchart of an example process for restricting access to supervisory functions provided by the supervisory processor. At step 502 the program memory of a supervisory processor is initialized with a supervisor program. The supervisor program contains a set of service routines, some or all of which may be privileged services that are accessible only by application logic having the appropriate permissions.

At step 504, a command is received from the application logic requesting a particular device management service. At decision 506, the service request is checked to determine whether the service request is a privileged service. If the service is not a privileged service, then the process proceeds to step 508. If the service request is a privileged service, then the process proceeds to decision 510 with a further check made to determine whether the application has appropriate permissions. If the application has appropriate permissions for a privileged service, the process proceeds to step 508, and otherwise the process proceeds to step 512. An error status may be returned to the application at step 512 to notify the application that access to the requested service has been denied due to inadequate permissions.

In one embodiment, a privilege vector has an enable bit for each privileged service. During permission checking, this vector is examined to determine whether the corresponding enable bit is set. The privilege vector may be part of the supervisor and may be initialized during configuration, with enabled privileges specified during application development. By default no privileged services are enabled.

In one embodiment the routine for a privileged service is not included in the supervisor program unless the service has been enabled during application development. In response to a request for a service that is not included, the supervisor may discard the command and parameters and return an error status to the application.

In another embodiment, an attribute vector has an enable bit for each of a set of privilege attributes, such as reconfiguration, power control, and device reset. Each privileged service request requires one or more of the privilege attributes. For example, clock reconfiguration may require both the reconfiguration and device reset attributes to be enabled. When a command for a device management request is received from the application logic, the attribute vector is checked to determine whether all of the required attributes have been enabled. The attribute vector may be part of the supervisor and initialized during configuration, with enabled attributes specified during the development of the application.

In yet another embodiment, the service routines are password protected. In order to access a service routine, the application provides a password as a parameter for a privileged command. The password is checked by the supervisor program to determine whether the password grants access to the service routine for the command. The supervisor refuses to execute the routine when the application logic does not have the appropriate permissions. The supervisor program may return an error status to the application when there are insufficient permissions. In an embodiment with more than one application port, independent permission checking may be provided at each port.

Service routines for privileged services may be encrypted in another embodiment. A decryption key must be provided before the supervisory processor can decrypt and execute the privileged service. The decryption key may be provided as a parameter of the service request or as a parameter of a prior service request to store a key. Alternatively, the decryption key may be obtained from a user by the supervisor.

At step 508 the appropriate service routine is determined and fetched from program memory when the application has appropriate permissions. At step 514 this service routine is executed by the supervisory processor.

The present invention is believed to be applicable to a variety of systems for performing device management functions on an IC, which includes a PLD, Application Specific Integrated Circuit (ASIC), or other application specific circuit, and has been found to be particularly applicable and beneficial in providing both flexibility in implementing device management functions and controlling access to the device management functions. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An integrated circuit, comprising:
    a plurality of configurable logic resources;
    an interconnect circuit configurable to selectively couple the configurable logic resources;
    a plurality of device management resources;
    a first interface circuit coupled to a set of interface ports that are coupled to the interconnect circuit;
    a second interface circuit coupled to the device management resources;
    a control store configured with control codes for accessing the device management resources; and
    a control circuit coupled to the first interface circuit, the second interface circuit, and the control store, wherein the control circuit, responsive to a command received via the first interface circuit, is configured to read control codes from the control store and access a device management resource via the second interface circuit in response to values of the control codes,
    wherein the command is received from application logic implemented on the plurality of configurable logic resources and the command calls for access to a selected one of the device management resources,
    wherein the control circuit checks whether the application logic has permission to access the selected one of the device management resources and denies access to read the control codes in response to the application logic not having permission to access the selected one of the device management resources, and
    wherein the command is received from logic implemented on the configurable logic resources.

2. The integrated circuit of claim 1, wherein the device management resources include a configuration controller coupled to the control circuit, the configuration controller arranged to configure the configurable logic resources and interconnect circuit responsive to control from the control circuit.

3. The integrated circuit of claim 2, wherein the configuration controller is further arranged to read configuration data from the configurable logic resources and from the interconnect circuit responsive to control from the control circuit.

4. The integrated circuit of claim 1, wherein the device management resources include at least one device power control resource coupled to the control circuit, the power control resource arranged to control power to at least a portion of the device responsive to control from the control circuit.

5. The integrated circuit of claim 1, wherein the device management resources include a clock management resource, the clock management resource arranged to control frequency of a clock signal to the configurable logic resources responsive to control from the control circuit.

6. The integrated circuit of claim 1, wherein the device management resources include a temperature sensor coupled to the control circuit.

7. The integrated circuit of claim 1, wherein the device management resources include a multi-gigabit per second serial transceiver.

8. The integrated circuit of claim 1, further comprising a plurality of sets of interface ports coupled to the interconnect circuit and accessible to the configurable logic resources.

9. The integrated circuit of claim 8, wherein each set of interface ports includes an activation port, a command port, a parameters port, a results port, and a sequence port, wherein the control circuit receives a command code from the command port and reads from the control store control code associated with the command code responsive to a signal on the activation port, data on the parameters port is provided as input to the selected control code, data output from execution of the selected control code is output on the results port, and sequencing of the selected control code is controlled via at least one signal on the sequence port.

10. A method for providing access to device management resources of a programmable logic device (PLD) by application logic implemented on configurable logic resources and configurable interconnect circuitry of the PLD, comprising:
    configuring a control store in the PLD with control codes;
    receiving from the application logic at a processor implemented on the PLD, a command calling for access to a selected one of the device management resources;
    checking whether the application logic has permission to access the selected one of the device management resources;
    denying access to selected control codes for accessing the selected one of the device management resources in response to the application logic not having permission to access the selected one of the device management resources;
    fetching from the control store by the processor the selected control codes in response to the command;
    executing the selected control codes by the processor; and
    accessing the selected one of the device management resources in response to executing the control codes.

11. The method of claim 10, wherein the device management resources include a configuration controller arranged to configure the configurable logic resources and interconnect circuitry, and the accessing step comprises sending configuration data from the processor to the configuration controller in response to execution of the selected control codes.

12. The method of claim 11, wherein the configuration controller is further arranged to read configuration data from the configurable logic resources and from the interconnect circuit, and the accessing steps comprises receiving configuration data from the configuration controller at the processor in response to execution of the selected control codes.

13. The method of claim 10, wherein the device management resources include at least one device power control resource coupled to the processor, and the accessing step comprises activating a control signal by the processor to the power control resource in response to execution of the selected control codes.

14. The method of claim 10, wherein the device management resources include a clock management resource coupled to the processor and arranged to control frequency of a clock signal to the configurable logic resources, and the accessing step comprises activating a control signal by the processor to the clock management resource in response to execution of the selected control codes.

15. The method of claim 10, wherein the device management resources include a temperature sensor coupled to the processor, and the accessing step comprises obtaining data from the temperature sensor in response to execution of the selected control codes.

16. The method of claim 10, wherein the device management resources include a multi-gigabit per second serial transceiver, and the accessing step comprises activating a control signal to the multi-gigabit per second serial transceiver in response to execution of the selected control codes.

17. The method of claim 10, wherein the control codes in the control store are encrypted, the method further comprising:
  receiving a key from the application logic; and
  decrypting the selected control codes using the key.

18. A circuit arrangement for providing access to device management resources of an integrated circuit (IC) by application logic implemented on configurable logic resources and configurable interconnect circuitry, comprising:
  means for configuring a control store in the IC with control codes;
  means for receiving from the application logic at a processor implemented on the IC, a command calling for access to a selected one of the device management resources;
  means for checking whether the application logic has permission to access the selected one of the device management resources;
  means for denying access to selected control codes for accessing the selected one of the device management resources in response to the application logic not having permission to access the selected one of the device management resources;
  means, responsive to the command, for fetching from the control store by the processor the selected control codes;
  means for executing the selected control codes by the processor; and
  means, responsive to execution of the control codes, for accessing the selected one of the device management resources.

19. A programmable logic device, comprising:
  a plurality of configurable logic resources;
  an interconnect circuit configurable to selectively couple the configurable logic resources;
  a plurality of device management resources, including a temperature sensor, a power controller, a configuration controller, a digital clock manager, and a multi-gigabit per second serial transceiver;
  a first interface circuit coupled to a plurality of sets of interface ports that are coupled to the interconnect circuit;
  a second interface circuit coupled to the device management resources;
  a control store configured with control codes for accessing the device management resources; and
  a processor coupled to the first interface circuit, the second interface circuit, and the control store, wherein the processor, responsive to a command received via the first interface circuit, is configured to fetch selected control codes from the control store, execute the control codes, and access a selected device management resource via the second interface circuit in response to executing the control codes,
  wherein the command calls for access to a selected one of the device management resources,
  wherein the control circuit checks whether the application logic has permission to access the selected one of the device management resources and denies access to read the control codes in response to the application logic not having permission to access the selected one of the device management resources, and
  wherein the command is received from logic implemented on the configurable logic resources.

\* \* \* \* \*